United States Patent
Lo et al.

(10) Patent No.: US 6,414,384 B1
(45) Date of Patent: Jul. 2, 2002

(54) PACKAGE STRUCTURE STACKING CHIPS ON FRONT SURFACE AND BACK SURFACE OF SUBSTRATE

(75) Inventors: Randy H. Y. Lo, Taichung Hsien; Chien-Ping Huang, Hsinchu Hsien; Chi-Chuan Wu, Taichung, all of (TW)

(73) Assignee: Silicon Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/746,793

(22) Filed: Dec. 22, 2000

(51) Int. Cl.[7] .............................................. H01L 23/02
(52) U.S. Cl. ..................... 257/685; 257/686; 257/777
(58) Field of Search ................... 257/865, 686, 257/777; 156/60; 361/414; 438/107, 108

(56) References Cited

U.S. PATENT DOCUMENTS

| | | | |
|---|---|---|---|
| 5,222,014 A | * 6/1993 | Lin | 361/414 |
| 5,801,072 A | * 9/1998 | Barber | 438/107 |
| 5,804,004 A | * 9/1998 | Tuckerman et al. | 156/60 |
| 5,994,166 A | * 11/1999 | Akram et al. | 438/108 |
| 6,166,443 A | * 12/2000 | Inaba et al. | 257/777 |

FOREIGN PATENT DOCUMENTS

JP   H.4-302164   * 10/1992   ......... H01L/25/065

* cited by examiner

*Primary Examiner*—Hoai V. Ho
*Assistant Examiner*—Thinh T Nguyen
(74) *Attorney, Agent, or Firm*—J. C. Patents

(57) ABSTRACT

A package structure stacking chips on a front surface and a back surface of a substrate including at least a substrate, a plurality of chip sets, a plurality of support members, a plurality of glue layers, a plurality of wires, and a mold compound. The substrate has a front surface and a back surface opposite to the front surface. Each chip set has one or more chips, each chip having a plurality of bonding pads. The chip sets are stacked as a laminate on the front surface of the substrate, respectively. A plurality of support members are arranged between each two adjacent chip sets. A glue layers are used to connect the support members, the chip sets, and the substrate. The chip in the same chip sets is electrically connected to each other or to the substrate by the bonding pads. Finally, the front surface of the substrate, the support members, the chip sets, and the glue layers are encapsulated with a mold compound. Moreover, a plurality of flip chips are deposited on the back surface of the substrate.

20 Claims, 5 Drawing Sheets

PACKAGE STRUCTURE STACKING CHIPS ON FRONT SURFACE AND BACK SURFACE OF SUBSTRATE

BACKGROUND OF THE INVENTION

1. Field of the Invention

The present invention relates to a package structure stacking chips on a front surface and a back surface of a substrate. More specifically, the present invention relates to a structure of ball grid array package stacking chips on a front surface and a back surface of a substrate.

2. Description of the Related Art

Recently, an integrated circuit plays an important role in our daily life. Many products obtained from integrated circuit devices are always used. With increasing development in electronics, electronic products having humanized operation and higher performance are available. However, various products are designed such that the features, such as lesser weight and compact size, are provided for comfortable use. In the semiconductor fabricating process, a semiconductor product having higher integration is available because of mass production of the 0.18 micrometer integrated circuit.

In general, the production of an integrated circuit (IC) includes three stages: silicon wafer production, semiconductor process and IC packaging.

Various technologies for IC packaging have been developed due to competition in the market. Many high-density packages such as chip scale package (CSP), wafer level package or multiple chip module (MCM) are manufactured. In device assembly, a multi-level PCB having higher density can be used to allow the IC packaging to be arranged on the PCB more compactly.

The current IC packaging for the integrated circuit has been developed to incorporated a Read Only Memory (ROM), a Static Random Access Memory (SRAM), a flash memory or a Dynamic Random Access Memory (DRAM), a Logic Circuit, and a digital circuit into a chip, known as System On Chip (SOC) to satisfy the demand for light weight, compact size and perfect performance. An embedded ROM is one embodiment of the circuit having both a flash memory and a logic circuit.

However, in the conventional system on chip (SOC), a plurality of chips, such as DRAM, flash memory, Logic Circuit and radio frequency (RF) devices, are incorporated into a chip. Although the functionality and electric property thereof can be thus enhanced, it is more complicated to design a layout in circuit connection. Since the fabrication methods for devices having various functions are different from each other, the fabrication for devices having various functions becomes complex, resulting in reduced yield and increased cost of fabrication.

One way to solve the above captioned problems is to adopt stacked chips that are usually used in a ball grid array package, for example, to increase the capacity of memory.

Referring to FIG. 1, a cross sectional view of a conventional package structure is shown.

As shown in FIG. 1, a first chip 106 is deposited on a substrate 102, and a second chip 108 is stacked on the first chip 106. The first chip 106 and the second chip 108 are adhered by a glue layer 104. Wire bonding is then performed to electrically connect the first chip 106 and the second chip 108 to the substrate 102 by wires 110a and 110b, respectively. The substrate 102, the first chip 106, the second chip 108 and the wires 110a and 110b are then encapsulated with a mold compound 114. Finally, solder balls 112 are mounted on the substrate 102 to complete a ball grid array package (BAG).

However, the first chip must be much larger than the second chip in BGA, with difference of the lengths of the first chip and the second chip being at least 0.3 mm. If the difference is smaller than 0.3 mm, wire bonding cannot be performed or the second chip contacts the wire 110a.

Referring to FIG. 2, a cross sectional view of a conventional flip chip package is shown.

As shown in FIG. 2, U.S. Pat. No. 5,801,072 discloses a substrate 202 having a front surface 201 and a back surface 203 opposite to the front surface 201. A first chip 206 is deposited on the front surface 201 of the substrate 202, and a second chip 208 is correspondingly deposited on the back surface 203 of the substrate 202. The first chip 206 and the second chip 208 are provided on the substrate 202 by flip chip technology and have substantially the same size. The first chip 206 is encapsulated with a mold compound 214. Finally, solder balls 212 are mounted on the back surface 203 of the substrate 202 to complete a package.

In such package, only the first chip 206 is provided on only the front surface 201 of the substrate 202 by flip chip technology and relatively limited performance for the integration of the chips.

Referring to FIGS. 3A and 3B, a top view and cross sectional view of another conventional multiple chip module are shown. FIG. 3B is a cross sectional view of FIG. 3A along 3B—3B.

As shown in FIGS. 3A and 3B, a multiple chip module (MCM) package is disclosed. A main chip 305, a first chip 306 and a second chip 308 are arranged side-by-side on a substrate 302. The connection of the main chip 305, the first chip 306 and the second chip 308 to the substrate 302 is achieved by a glue layer 304. Wire bonding is subsequently performed to electrically connect the main chip 305, the first chip 306 and the second chip 308 to the substrate 302 by wires 310. The substrate 302, the main chip 305, the first chip 306, the second chip 308 and the wires 310 are encapsulated with a mold compound 314. Finally, solder balls 312 are mounted on the substrate 302 to complete a multiple chip module package.

The main characteristic for a conventional multiple chip module package structure is to integrate devices having multiple functions into a package. Because the area occupied by the devices is large so as to make routability of the substrate 302 complicated, a substrate 302 having high trace density is thus desirably used. The side-by-side arrangement of the main chip 305, the first chip 306 and the second chip 308 influences adversely the amount of chips that can be accommodated in the multiple chip module package, therefore resulting in lowered integration, increased production cost and reduced performance.

SUMMARY OF THE INVENTION

It is therefore an object of the present invention to provide a package structure stacking chips having substantially the same size on the front surface and the back surface of the substrate.

It is another object of the present invention to provide a package structure which integrates chips having substantially the same size in various directions on the front surface and the back surface of the substrate.

It is another object of the present invention to provide a package structure integrating chips having substantially the same size in various directions, in which the front surface of the substrate is subject to wire bonding and the back surface thereof is subject to a flip chip process.

It is still another object of the present invention to provide a package structure integrating chips having substantially the same size in various directions, in which multiple chips are stacked on the front and back surfaces without changing the dimensions of the original package.

According to the above objects of the present invention, a package structure stacking multiple chips on a front surface and a back surface of a substrate comprises at least a substrate, a plurality of chip sets, a plurality of support members, a plurality of glue layers, a plurality of wires, a plurality of flip chips and a mold compound. The substrate has a front surface and a back surface opposite to the front surface. A plurality of chip sets comprises one or more chips having a plurality of bonding pads, while stacking on the front surface of the substrate as a laminate. A plurality of support members are arranged between each two adjacent chip sets. The connections between the support members, the chip sets, and the substrate are achieved by a plurality of glue layers. Chip sets are electrically connected to each other or to the substrate. Finally, the front surface of the substrate, the support members, the chip sets, and the glue layers are encapsulated with a mold compound. Moreover, a plurality of flip chips are deposited on the back surface of the substrate.

According to a preferred embodiment of the present invention, a package structure having stacked chips on the front surface and back surface of the substrate is provided. By stacking chips having substantially the same size, such structure not only decreases the area occupied by the package devices, but also has more effective routability on the substrate without use of the substrate having high trace density. Thus, more stacked chips can be packaged in the multiple chip module. This leads to improved integration, reduced production cost and enhanced performance. The package structure of the present invention is to integrate chips having substantially the same size in various directions, in which the front surface of the substrate is subject to wire bonding and the back surface thereof is subject to flip chip process. The simultaneous integration of chips on the front surface in vertical and transverse directions can be achieved without changing the dimensions of the original package. That is, the chips on the front surface and the back surface have substantially the same size with a deviation within 0.3 mm, such that the chips are arranged compactly. Such structure doesn't encounter the limitations of the prior art.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
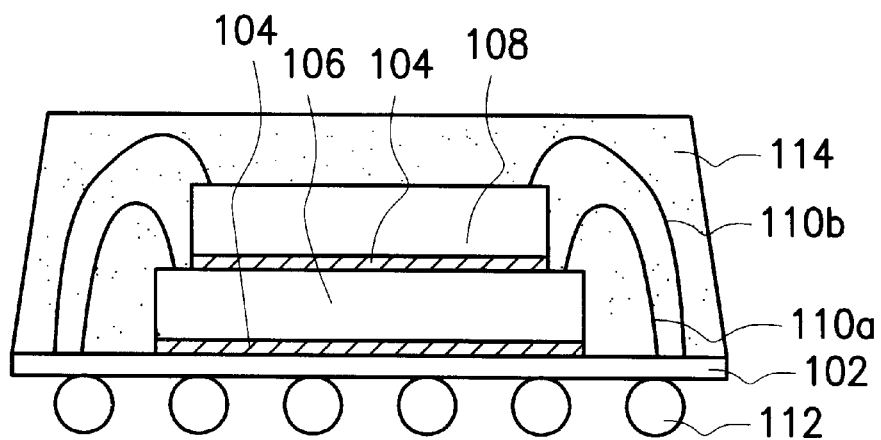
FIG. 1 is a cross sectional view of a conventional package structure having stacked chips.
Figure 2:
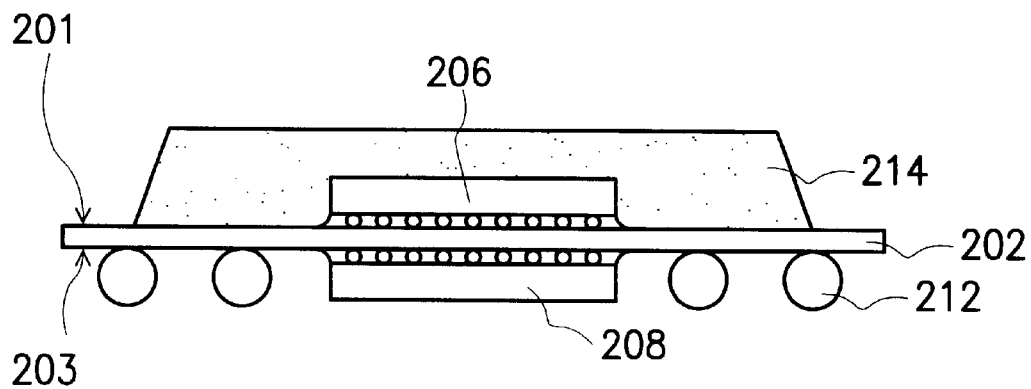
FIG. 2 is a cross sectional view of a conventional structure of flip chip package.
Figure 3A:
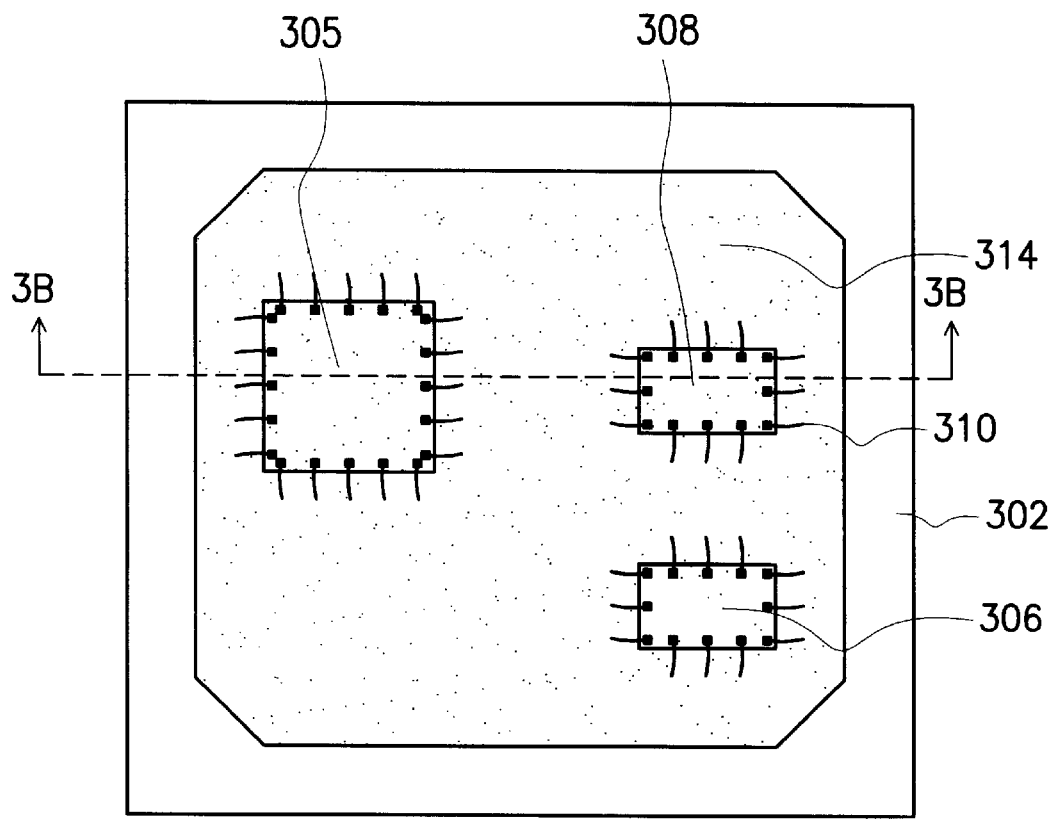
FIG. 3A is a top view of another conventional structure of multiple chip module package.
Figure 3B:
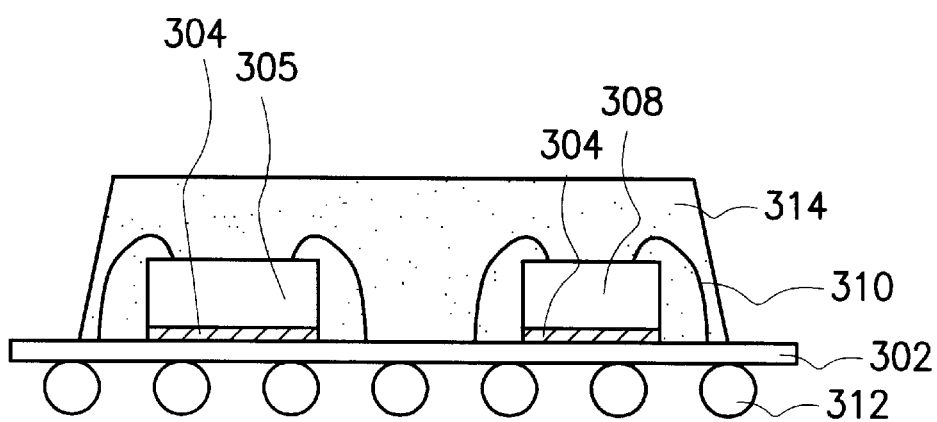
FIG. 3B is a cross sectional view of another conventional structure of multiple chip module package.
Figure 4A:
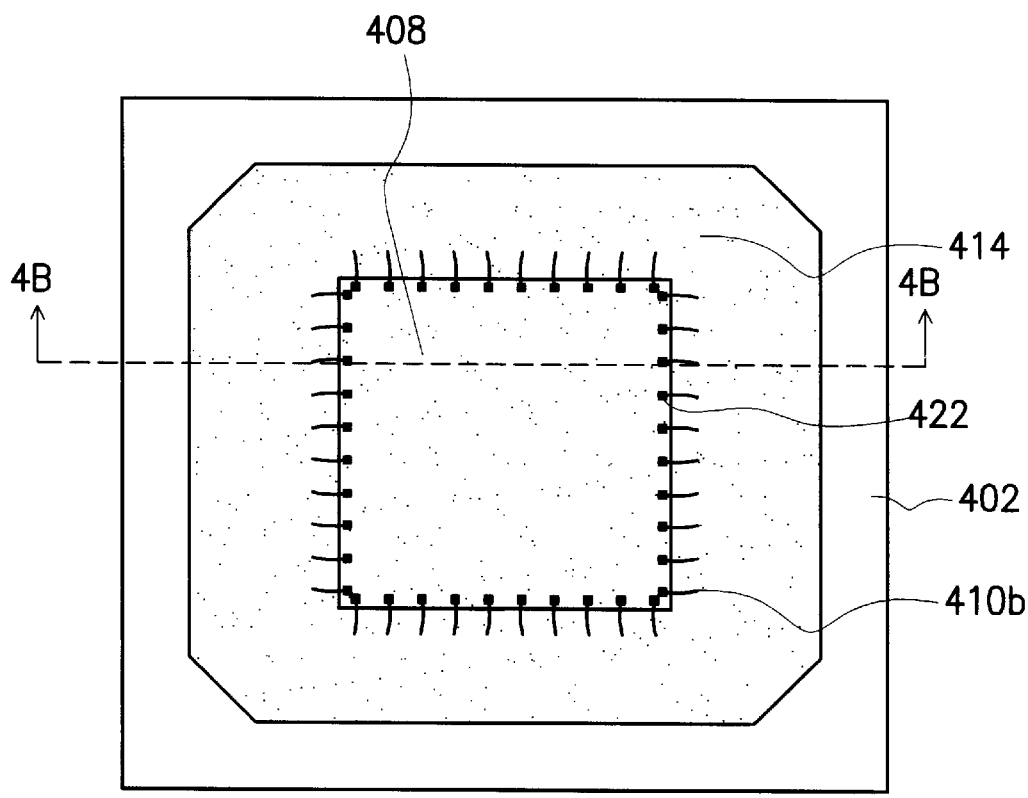
FIG. 4A is a top view of a package structure stacking multiple chips on the front surface and the back surface of the substrate according to the first preferred embodiment of the present invention.
Figure 4B:
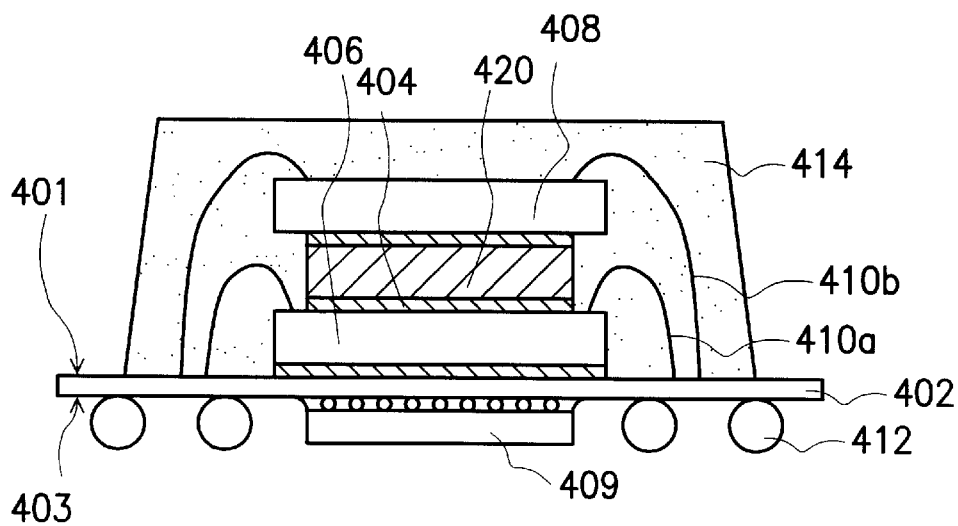
FIG. 4B is a cross sectional view of a package structure stacking multiple chips on the front surface and the back surface of the substrate according to the first preferred embodiment of the present invention.

FIG. 4 is a top view of a package structure stacking multiple chips on the front surface and the back surface of the substrate according to the first preferred embodiments of the present invention. FIG. 4B is a cross sectional view of FIG. 4A along line 4B—4B.

As shown in FIGS. 4A and 4B, a substrate 402 has a front surface 401 and a back surface 403 opposite to the front surface 401. A first chip 406 and a second chip 408, such as memory chips, are provided with substantially the same size. The peripheries of the first chip 406 and the second chip 408 are provided with a plurality of bonding pads 422. First, the first chip 406 is deposited on the front surface 401 of the substrate 402. The first chip 406 is electrically connected to the substrate 402 by wires 410a. Support member 420 is deposited on the first chip 406. Then, the second chip 408 is deposited on the support member 420. The second chip 408 is electrically connected to the substrate 402 by wires 410b. The support member 420, the first chip 406, the second chip 408 and the substrate 402 are adhered by a plurality of glue layers 404. The material used for the glue layers 404 is silver paste or materials that are thermally conductive but not electrically conductive, for example.

Subsequently, the front surface 401 of the substrate 402, the support member 420, the first chip 406 and the second chip 408 are encapsulated with a mold compound 414. The glue layers 404 can be also contained therein. The mold compound 414 includes insulating materials, such as epoxy resin. A third chip 409, such as Application Specification Integration Circuit (ASIC), is deposited on the back surface 403 of the substrate 402 by flip chip technology, for example. The third chip 409 helps to support some functions to drive the first chip 406 and the second chip 408 on the front surface 401 of the substrate 402. Finally, solder balls 412 can be mounted on the back surface 403 of the substrate 402 to provide the performance of Input/Output. The support member 420 includes a silicon dummy chip having good heat dissipation or other metal, with coefficient of thermal expansion similar or substantially equivalent to that of the first chip 406 and the second chip 408, therefore the problems with regard to thermal stress would not be generated.

Figure 5A:
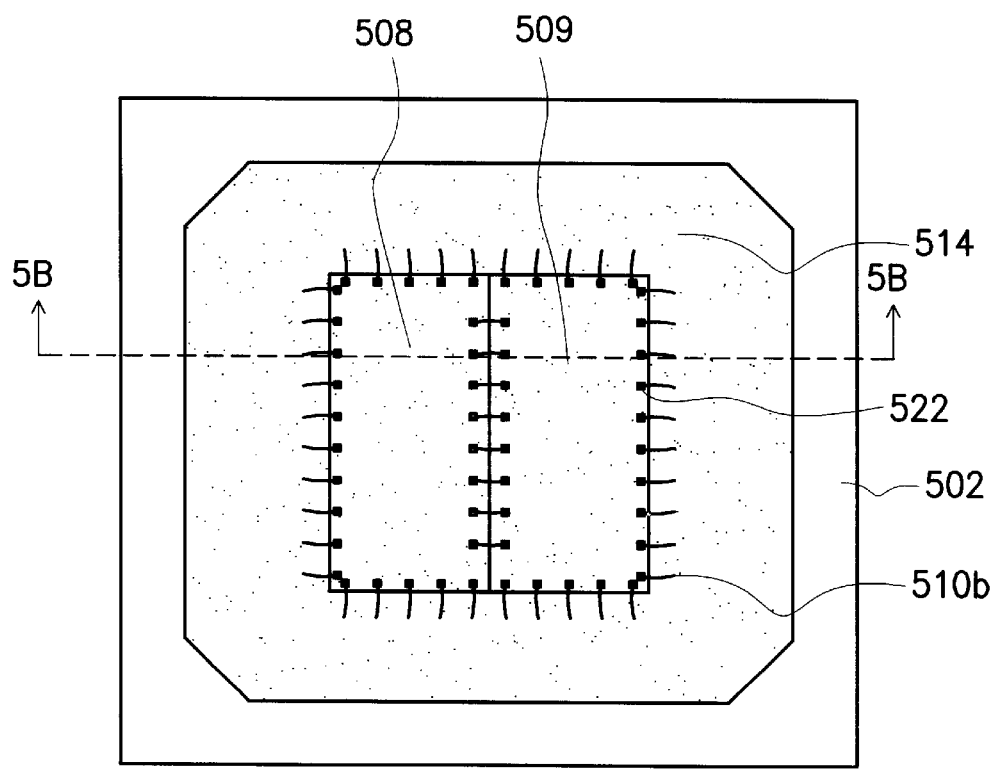
FIG. 5A is a top view of a package structure stacking multiple chips on the front surface and the back surface of the substrate according to the second preferred embodiment of the present invention.
Figure 5B:
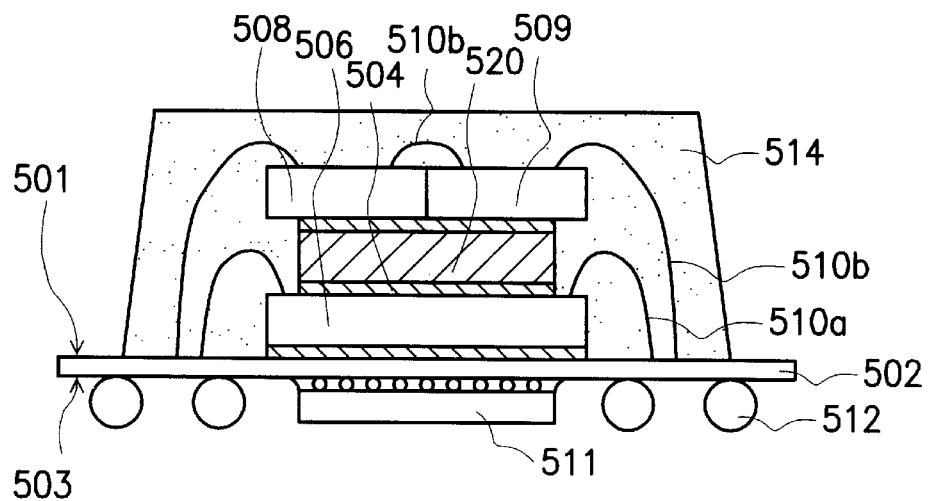
FIG. 5B is a cross sectional view of a package structure stacking multiple chips on the front surface and the back surface of the substrate according to the second preferred embodiment of the present invention.

FIGS. 5A and 5B are top views and cross sectional view of a package structure stacking multiple chips on the front surface and the back surface of the substrate according to the second preferred embodiment of the present invention.

As shown in FIGS. 5A and 5B, a substrate 502 has a front surface 501 and a back surface 503 opposite to the front surface 501. A first chip 506, a second chip 508 and a third chip 509 are provided, in which the second chip 508 and the third chip 509 are arranged side by side in the same plane into a chip set. The chip set has substantially the same size as the first chip 506 stacked thereunder. The periphery of the first chip 506, the second chip 508 and the third chip 509 are provided with a plurality of bonding pads 522, respectively. First, the first chip 506 is arranged on the front surface 501 of the substrate 502. The first chip 506 is electrically connected to the substrate 502 by wires 510a. Support member 520 is deposited on the first chip 506, and the second chip 508 and the third chip 509 stacked side by side are deposited on the support member 520. The bonding pads 522 of both second chip 508 and third chip 509 are electrically connected to one another, proximate to the adjacent edges for example, and to the substrate 502 by corresponding wires 510b. The support members 520, the first chip 506, the second chip 508, the third chip 509, and the substrate 502 can be adhered by a plurality of glue layers 504.

Subsequently, the front surface 501 of the substrate 502, the support member 520, the first chip 506, the second chip 508 and the third chip 509 are encapsulated with a mold compound 514. A fourth chip 511, such as Application Specification Integration Circuit (ASIC), is provided on the back surface 503 of the substrate 502. The fourth chip 511 supports some functions to drive the first chip 506, the second chip 508 and the third chip 509 on the front surface 501 of the substrate 502. Finally, solder balls 512 are mounted on the back surface 503 of the substrate 502.

Figure 6:
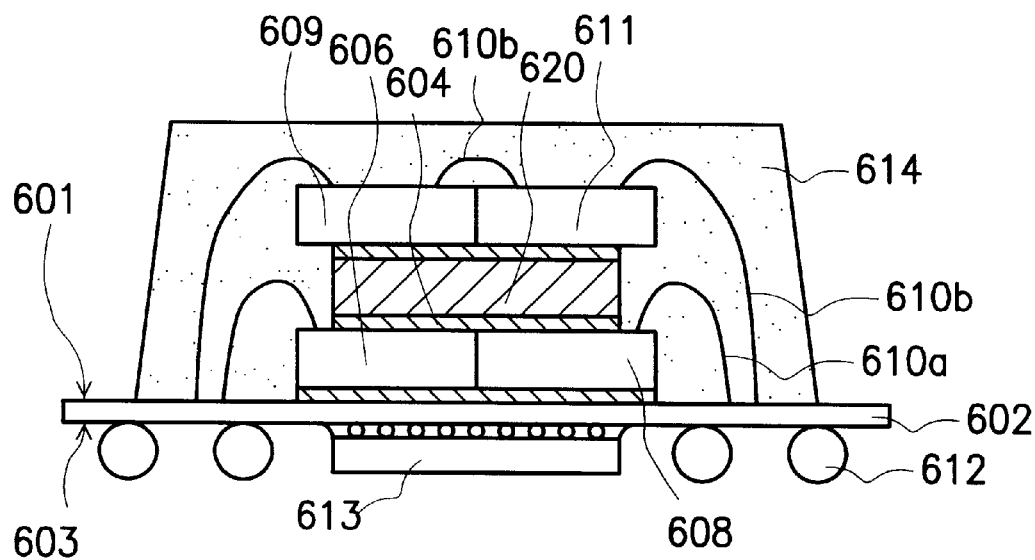
FIG. 6 is a cross sectional view of a package structure stacking multiple chips on the front surface and the back surface of the substrate according to the third preferred embodiment of the present invention.

FIG. 6 is a cross sectional view of a package structure stacking multiple chips on the front surface and the back surface of the substrate according to the third preferred embodiment of the present invention.

As shown in FIG. 6, a substrate 602 has a front surface 601 and a back surface 603. A first chip 606, a second chip 608, a third chip 609 and a fourth chip 611 are provided, each including a plurality of bonding pads. The first chip 606 is next to the second chip 608, and the third chip 609 is next to the fourth chip 611. Each chip has substantially the same size. First, the first chip 606 and the second chip 608 are deposited on the front surface 601 of the substrate 602. The first chip 606 and the second chip 608 are electrically connected to the substrate 602 by wires 610a, respectively. The support member 620 is deposited on the first chip 606 and the second chip 608. The third chip 609 and the fourth chip 611 then stacked side by side are deposited on the support member 620. The bonding pads of both third chip 609 and fourth chip 611 are electrically connected either to one another, proximate to the adjacent edges for example, or to the substrate 602 via wires 610b. The support member 620, the first chip 606, the second chip 608, the third chip 609, the fourth chip 611 and the substrate 602 can be adhered by a plurality of glue layers 604. Subsequently, the front surface 601 of the substrate 602, the support member 620, the first chip 606, the second chip 608, the third chip 609 and the fourth chip 611 are encapsulated with a mold compound 614. A fifth chip 613 is deposited on the back surface 603 of the substrate 602 by flip chip technology. The chip 613 supports some functions to drive the first chip 606, the second chip 608, the third chip 609 and the fourth chip 611 on the front surface 601 of the substrate 602. Finally, solder balls 612 are mounted on the back surface 603 of the substrate 602.

Figure 7:
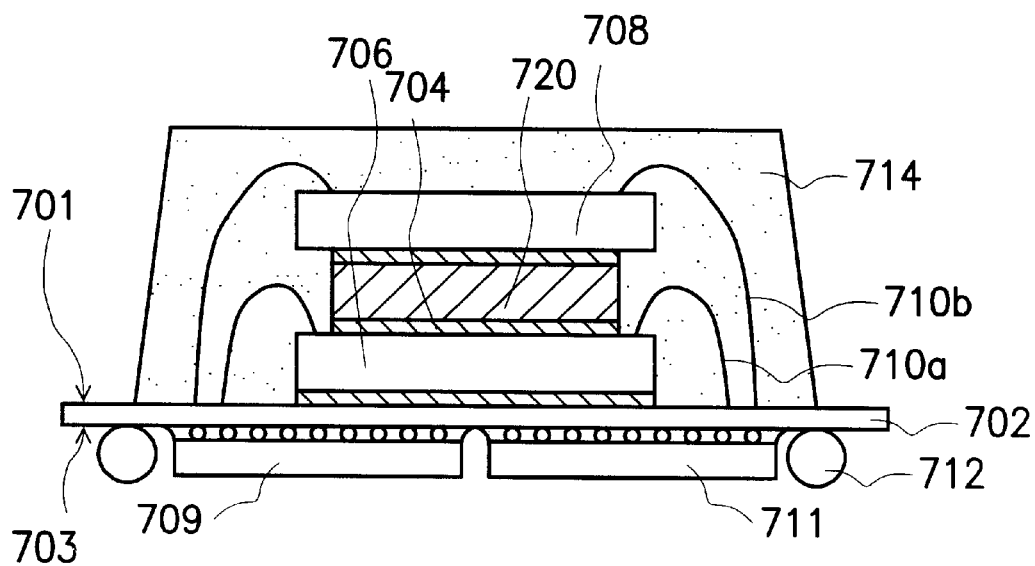
FIG. 7 is a cross sectional view of a package structure stacking multiple chips on the front surface and the back surface of the substrate according to the fourth preferred embodiment of the present invention.

FIG. 7 is a cross sectional view of a package structure stacking multiple chips on the front surface and the back surface of the substrate according to the fourth preferred embodiment of the present invention.

As shown in FIG. 7, a substrate 702 has a front surface 701 and a back surface 703 opposite to the front surface 701. A first chip 706 and a second chip 708 are provided with substantially the same size. The peripheries of the first chip 706 and the second chip 708 are provided with a plurality of bonding pads. First, the first chip 706 is deposited on the front surface 701 of the substrate 702. The first chip 706 is electrically connected to the substrate 702 by wires 710a. The support member 720 is deposited on the first chip 706, and the second chip 708 is then stacked on the first chip 706 and the support members 720. The second chip 708 is electrically connected to the substrate 702 by wires 710b.

The support member 720, the first chip 706, the second chip 708, and the substrate 702 can be adhered by a plurality of glue layers 704. Subsequently, the front surface 701 of the substrate 702, the support member 720, the first chip 706 and the second chip 708 are encapsulated with a mold compound 714. A third chip 709 and a fourth chip 711, such as Application Specification Integration Circuit (ASIC), are deposited on the back surface 703 of the substrate 702 by flip chip technology. The chips 709 and 711 support some functions to drive the first chip 706 and the second chip 708 on the front surface 701 of the substrate 702. Finally, solder balls 712 are mounted on the back surface 703 of the substrate 702.

As mentioned above, the present invention has the advantages as follows:

1. By stacking chips having substantially the same size, such structure not only decreases the area occupied by the package devices, but also has more effective routability on the substrate without use of the substrate having high trace density.
2. More stacked chips can be packaged in the multiple chip module. This leads to improved integration, reduced production cost and enhanced performance.
3. The package structure of the present invention can integrate chips having substantially the same size in various directions, such as vertical and transverse directions in the embodiments set forth above, in which the back surface of the substrate is subject to flip chip technology without changing the dimensions of the original package. The chips on the front surface and the back surface have substantially the same size with deviation smaller than 0.3 mm so as to have high density in integration. Such a structure does not suffer the limitations of the prior art.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A package structure with chips stacked on a front surface and a back surface of a substrate, comprising:

a substrate having a front surface and a back surface opposite to the front surface;

a plurality of chip sets, each chip set including one or more chips, each chip comprising a plurality of bonding pads, and the chip sets being stacked according to a lamination manner on the front surface of the substrate, wherein the chips of each chip set are arranged side by side in the same plane and an upper chip set and a lower chip set in the stack have substantially the same size within a deviation range of 0.3 mm;

a plurality of support members arranged between every two adjacent chip sets, respectively;

a plurality of glue layers arranged between the support members, the chip sets, and the substrate;

a plurality of wires electrically connecting the chips to one another and to the substrate;

a mold compound covering the front surface of the substrate, the support members, the chip sets, and the glue layers; and a plurality of flip chips deposited on the back surface of the substrate.

2. The structure according to claim 1, wherein the back surface of the substrate further includes a plurality of solder balls.

3. The structure according to claim 1, wherein the material used for the support member is silicon.

4. The structure according to claim 1, wherein the support member is a dummy chip.

5. The structure according to claim 1, wherein the material used for the support member is metal, and the coefficient of thermal expansion of the support member is close to that of the chip.

6. The structure according to claim 1, wherein the material used for the glue layer is silver paste.

7. The structure according to claim 1, wherein the material used for the glue layer is thermally conductive but not electrically conductive.

8. The structure according to claim 1, wherein the mold compound is epoxy resin.

9. The structure according to claim 1, wherein the flip chips are Application Specific Integrated Circuits (ASICs).

10. A package structure with chips stacked on a front surface and a back surface of a substrate, comprising:

a substrate having a front surface and a back surface opposite to the front surface of the substrate;

a plurality of chip sets, each chip set including one or more chips, each chip comprising a plurality of bonding pads, and the chip sets being stacked according to a lamination manner on the front surface of the substrate;

a plurality of support members arranged between every two adjacent chip sets, respectively;

a plurality of glue layers arranged between the support members, the chip sets, and the substrate;

a plurality of wires electrically connecting the chips to one another and to the substrate;

a mold compound covering the front surface of the substrate, the support members, the chip sets, and the glue layers; and a flip chip deposited on the back surface of the substrate.

11. The structure according to claim 10, further comprising one or more flip chips deposited on the back surface of the substrate.

12. The structure according to claim 10, wherein the chips of each chip set are arranged side by side in the same plane and the upper chip set and the lower chip set in the laminate have substantially the same size with a deviation within 0.3 mm.

13. The structure according to claim 10, further comprising a plurality of solder balls on the back of the substrate.

14. The structure according to claim 10, wherein the material for the support member is silicon.

15. The structure according to claim 10, the support member is a dummy chip.

16. The structure according to claim 10, wherein the material used for the support member is metal, and the coefficient of thermal expansion of the support member is close to that of the chip.

17. The structure according to claim 10, wherein the material used for the glue layer is silver paste.

18. The structure according to claim 10, wherein the material used for the glue layer is thermally conductive but not electrically conductive.

19. The structure according to claim 10, wherein the mold compound is epoxy resin.

20. The structure according to claim 10, wherein the flip chip is Application Specific Integrated Circuits (ASICs).

* * * * *